United States Patent
Oukassi et al.

(10) Patent No.: US 10,658,584 B2
(45) Date of Patent: May 19, 2020

(54) ELECTROCHEMICALLY ACTUATABLE ELECTRONIC COMPONENT AND PROCESS FOR PRODUCING THE ACTUATABLE ELECTRONIC COMPONENT

(71) Applicant: COMMISSARIAT A L'ENERGIE ATOMIQUE ET AUX ENERGIES ALTERNATIVES, Paris (FR)

(72) Inventors: Sami Oukassi, Saint-Egreve (FR); Raphaël Salot, Lans-En-Vercors (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 552 days.

(21) Appl. No.: 15/348,892

(22) Filed: Nov. 10, 2016

(65) Prior Publication Data

US 2017/0138900 A1    May 18, 2017

(30) Foreign Application Priority Data

Nov. 17, 2015   (FR) ...................................... 15 61019

(51) Int. Cl.
*H01L 45/00* (2006.01)
*C23C 14/00* (2006.01)
(Continued)

(52) U.S. Cl.
CPC ...... *H01L 45/1266* (2013.01); *C23C 14/0036* (2013.01); *C23C 14/08* (2013.01);
(Continued)

(58) Field of Classification Search
CPC ..... H01L 45/1266; H01L 45/122–1246; H01L 45/085; H01L 45/1206; H01L 45/14; H01L 45/16
See application file for complete search history.

(56) References Cited

U.S. PATENT DOCUMENTS 7,262,899 B2   8/2007   Bigman
7,652,907 B2   1/2010   Bloch
(Continued)

FOREIGN PATENT DOCUMENTS

EP    2 605 274 A1    6/2013
EP    3 151 294 A1    4/2017
WO    2014/025434 A2   2/2014

OTHER PUBLICATIONS

Umberto Celano et al., "Three-Dimensional Observation of the Conductive Filament in Nanoscaled Resistive Memory Devices," Nano Letters, vol. 14, 2014, pp. 2401-2406.
(Continued)

*Primary Examiner* — Scott B Geyer
(74) *Attorney, Agent, or Firm* — Baker & Hostetler LLP (57) ABSTRACT

An electrochemically actuatable electronic component comprises: a substrate; at least one first and one second actuating electrodes; at least one first and one second measuring electrodes; at least one storing electrode configured to free ions under the action of the actuating electrodes; at least one ionic conductor able to conduct the ions and that is located in a region placed between the measuring electrodes; a device suitable for: applying a voltage or a current between the first and second actuating electrodes to allow the migration of ions from the storing electrode to the first actuating electrode forming thereon an electrochemical deposition through the ionic conductor and for measuring, between the first and second measuring electrodes, a modification of at least one characteristic of the region placed between the first and second measuring electrodes, to determine at least one characteristic of the electronic component.

20 Claims, 9 Drawing Sheets

(51) Int. Cl.
*C23C 14/08* (2006.01)
*C23C 14/16* (2006.01)
*C23C 14/34* (2006.01)
*C23C 16/34* (2006.01)
*C23C 16/50* (2006.01)
*C23C 16/56* (2006.01)
*C23F 1/12* (2006.01)
*C23F 1/16* (2006.01)
*C25D 13/02* (2006.01)
*G01N 27/447* (2006.01)
*G03F 7/20* (2006.01)

(52) U.S. Cl.
CPC ........ *C23C 14/165* (2013.01); *C23C 14/3464* (2013.01); *C23C 16/345* (2013.01); *C23C 16/50* (2013.01); *C23C 16/56* (2013.01); *C23F 1/12* (2013.01); *C23F 1/16* (2013.01); *C25D 13/02* (2013.01); *G01N 27/44756* (2013.01); *G03F 7/20* (2013.01); *H01L 45/085* (2013.01); *H01L 45/1206* (2013.01); *H01L 45/14* (2013.01); *H01L 45/16* (2013.01)

(56) References Cited

U.S. PATENT DOCUMENTS

| | | | |
|---|---|---|---|
| 8,410,469 | B2 | 4/2013 | Nessel et al. |
| 2010/0003600 | A1 | 1/2010 | Niessen et al. |
| 2010/0075181 | A1 | 3/2010 | Niessen et al. |
| 2013/0128332 | A1* | 5/2013 | Andersson Ersman ..................... G02F 1/155 359/266 |
| 2016/0025669 | A1* | 1/2016 | Sun ........................ H01G 9/022 205/790.5 |

OTHER PUBLICATIONS

Jiung Cho et al., "Electrochemically tunable thermal conductivity of lithium cobalt oxide," Nature Communications, vol. 5, 2014, pp. 1-6.

B.J. Neudecker et al., "'Lithium-Free' Thin-Film Battery with In Situ Plated Li Anode," Journal of the Electrochemical Society, vol. 147, No. 2, 2000, pp. 517-523.

\* cited by examiner

ELECTROCHEMICALLY ACTUATABLE ELECTRONIC COMPONENT AND PROCESS FOR PRODUCING THE ACTUATABLE ELECTRONIC COMPONENT

CROSS-REFERENCE TO RELATED APPLICATIONS

This application claims priority to foreign French patent application No. FR 1561019, filed on Nov. 17, 2015, the disclosure of which is incorporated by reference in its entirety.

FIELD OF THE INVENTION

The field of the invention is that of tuneable components, and more particularly electrochemically actuatable tuneable components.

BACKGROUND

A tuneable component is a component that may exhibit, on demand, several levels of a given response. The variation in the response is adjusted by applying an electric field. Generally, the variation in the response is associated with a modification of the physico-chemical properties of at least one material within the structure of the component. Variation in a plurality of types of responses may thus be envisaged, for example a variation in electronic conductivity, in dielectric constant, in thermal conductivity, in refractive indices or in mechanical quantities.

Electrochemical actuation is one particular case: the variation in the response of the component is associated with a change in one or more properties of a material following an electrochemical reaction, which is obtained by applying an electric field.

Electrochemical actuation has a number of advantages in comparison to other (electrostatic, thermal, piezoelectric, etc.) actuating modes:
   a very low energy consumption;
   a low actuating voltage;
   a very high adjustment precision, corresponding to a nanoscale theoretical variation in the electrochemical reactions.

Electrochemically actuatable tuneable components may be classed into two categories, depending on the mechanism of the electrochemical reaction at play.

Figure 1:
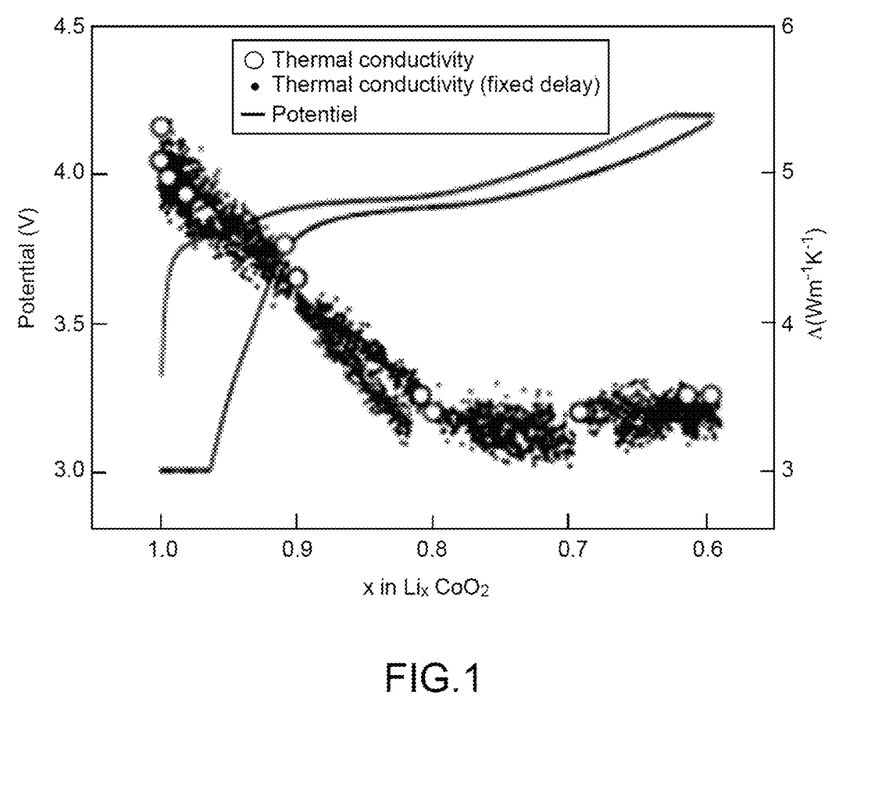
FIG. 1 illustrates the variation in the thermal conductivity of an $Li_xCoO_2$ material as a function of the degree of insertion of lithium x, according to the prior art.

First Category: Electrochemical Actuation by Insertion of Ions into an Electrode Material:

In this case, the insertion of an ion into a host structure of one material induces a change in the properties of said material and causes a variation in the response of the associated component. An example of this type of mechanism is reported in document Nature communications 5:4035-2014 and is illustrated in FIG. 1, which describes a variation in the thermal conductivity (in this case the variable property) of a material of $Li_xCoO_2$ composition during the insertion of $Li^+$ ions.

It will be noted that generally ion insertion is the mechanism that induces the change in the properties of the material. The ion insertion may take place via intercalation (in interstitial sites of the host structure), alloying, or even conversion mechanisms.

Figure 2:
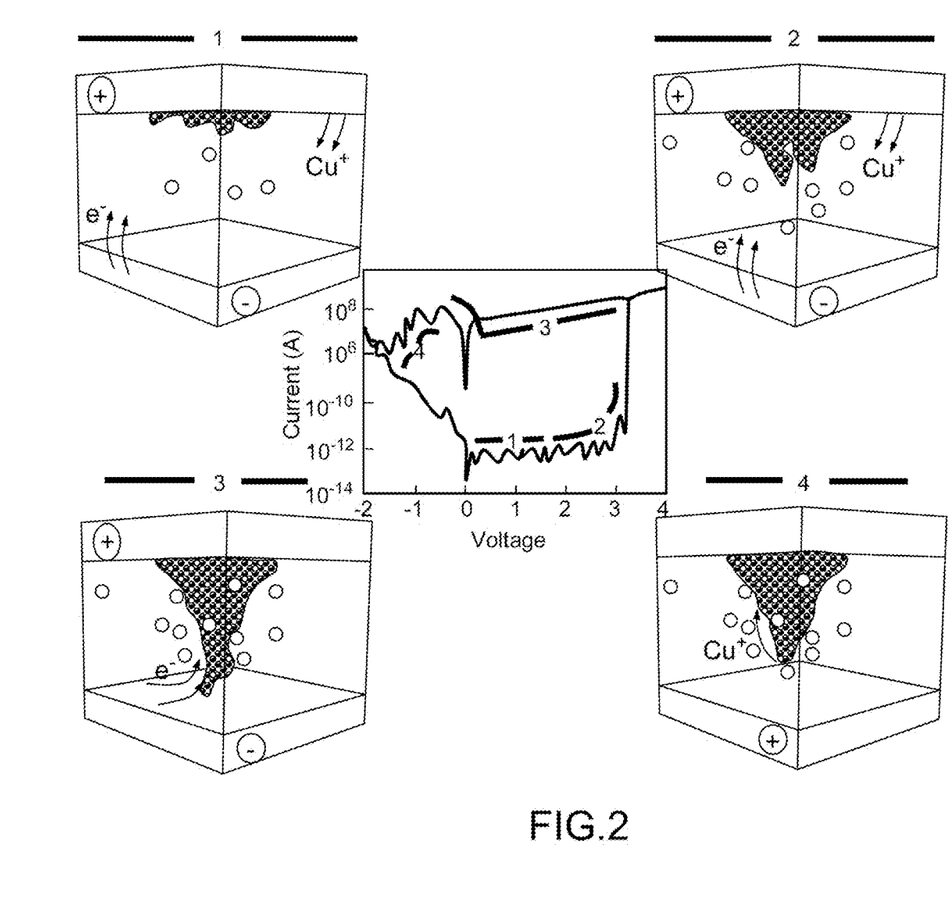
FIG. 2 illustrates the variation in the electronic conductivity caused by creating a Cu filament through a Cu ionic conductor according to the prior art.

Second Category: Electrochemical Actuation by Filament Formation Through an Ionic Conductor:

In this case, the formation of a filament by dissolution of ions through an ionic conductor induces a change in the properties of the (ionic conductor+filament) assembly, in comparison to the ionic conductor alone. An example of this type of mechanism is reported in document Nano Letters 14-2401-2014 and is illustrated in FIG. 2, which describes a variation in the electronic conductivity between two electrodes of a metal/$Al_2O_3$/metal system caused by the formation and removal of a metal filament generated by $Cu^+$ ions (producing a conductive state and an insulating state, respectively). It will be noted that in these cases the actuating and measuring electrodes are the same electrodes.

Thus, it will be understood that it is possible to modulate a substantial number of physico-chemical properties of materials, and to provide various component architectures that may be electrochemically actuated in the first or second of the modes described above.

Each of the actuating modes has a certain number of advantages and limitations, details of which will be given below in the present description.

Various approaches to tuneable electrochemical actuatable components have already been described in the patent literature.

Regarding Electrochemical Actuation by Insertion of Ions into an Electrode Material:

Patent application US20100003600 describes an electronic component of variable resistance employing the variation in the electronic conductivity of a material following insertion/deinsertion of $Li^+$ ions. The insertion is implemented via the existence of a collector/positive electrode/electrolyte/negative electrode/collector stack deposited on a substrate, and the variation in the resistance is measured via coplanar interdigitated electrodes passing through the insertion electrode.

Patent application US20100075181 describes an electronic component of variable capacitance, using the increase and decrease in volume of a material during the insertion/deinsertion reactions. The volume change induces a variation in the distance between two metal plates and therefore a variation in the capacitance measurement across the terminals of the two plates in question. The insertion is ensured by the presence of a current collector/positive electrode/electrolyte/negative electrode/collector structure deposited on a substrate.

U.S. Pat. No. 7,262,899 describes a component having a variable optical response (waveguide structure). In this case a current collector/positive electrode/electrolyte/negative electrode/collector structure is present with a top current collector composed of a plurality of lines spaced apart by a given distance. The preceding structure allows lithium ions to be controllably inserted into one of the two electrodes and its refractive index to be modified. The modification of the indices leads as a result to a variation in the propagation of certain wavelengths and allows the filtering performance of the component to be modulated.

U.S. Pat. No. 7,652,907 describes an electronic component of variable response used as a memory for storing data. The component is a variable voltage source having a current collector/positive electrode/electrolyte/negative electrode/collector structure. The structure forms a battery that is characterized by a voltage profile during the insertion/deinsertion of ions into/from the electrodes; the profile in the context of this document consists of a plurality of plateaus, each voltage value of a plateau corresponds to a data code in the memory, 0 or 1 for example.

Regarding Electrochemical Actuation by Filament Formation Through an Ionic Conductor:

Patent application WO2014/025434 describes an electronic component, namely a resistive or conductive-bridge memory storage node (CBRAM for conductive-bridge random access memory).

The electronic component is characterized by a resistance that varies depending on whether or not a conductive filament is present through an ionic conductor ($TaO_x$) placed between two metal contacts (Pd/Pd, see page 4 of the PDF document).

Patent EP2605274 describes a component of variable thermal conductivity. More specifically, an integrated circuit associated with a heat-removing system composed of a plurality of thermal bridges is described. Each thermal bridge is connected to a zone of the integrated circuit through a thermal switch composed of a metal/ionic conductor/metal trilayer.

The formation of a conductive filament through the ionic conductor allows passage from a (thermally) insulating mode to a conductive mode and allows the removal of the heat induced by the operation of the integrated circuit to be modulated.

U.S. Pat. No. 8,410,469 describes a radiofrequency switch (RF switch). The formation of a filament through an ionic conductor by application of a DC electric field between two electrodes allows the component to pass from an ON state to an OFF state and to ensure the conduction of a radiofrequency signal.

These two electrochemical actuating modes significantly influence the performance of the tuneable components in which they are implemented. Table 1 below summarises the major differences in their advantages and limitations. (Marked by (+) and (−), respectively).

TABLE 1

Comparison of the performance of tuneable components with respect to the actuating mode implemented.

|  | Electrochemical actuation by insertion | Electrochemical actuation by filament formation |
|---|---|---|
| Geometry | 2D/3D (+) | 1D (−) |
| Modulation ratio | Average (−) | High (+) |
| Intermediate states | Yes (+) | No (−) |
| Response time | >100 μs (−) | <1 μs (+) |
| Actuation voltage | low (1-2 V) (+) | low (1-2 V) (+) |
| Energy consumption | low (0.1-1 μJ) (+) | low (0.1-1 μJ) (+) |

Both actuating modes are characterized by a low actuating voltage and a very low energy consumption, this being inherent to electrochemical actuation generally.

As regards the geometry of the component, electrochemical actuation by insertion has the advantage that the state variation may be planar or volumic (2D) whereas filamentary actuation is by construction one-dimensional.

This aspect is important insofar as the geometry may limit the number of possible component architectures: for example, it is not possible to form a filament of diameter covering a large area (a few tens or hundreds of $\mu m^2$), or a substantial length (about one hundred microns), thereby limiting the size of a component to the aforementioned proportions.

As regards modulation ratio (ratio of the reachable extreme states of the variable quantity), actuation by filament formation is more advantageous. Specifically, the modulation of the response of a component is in this case associated with the intrinsic properties of two completely different materials, namely the ionic conductor (which is for example electronically insulating, thermally insulating and optically transmissive at a given wavelength) and the filament formed (which is electronically conductive, thermally conductive, and optically absorbent at a given wavelength, respectively), (other properties may be considered, the aforementioned are given by way of example).

In the case of actuation by insertion, the modulation is weaker insofar as the variation is achieved by changing the properties of a given material by passage from an inserted state to a deinserted state.

Electrochemical actuation by insertion allows a plurality of intermediate states of a given response to be obtained, each corresponding to a given degree of insertion of the ion in the structure of the host material.

The associated component is thus tuneable with a plurality of possible response levels in a given range.

In contrast, a component that is electrochemically actuated by filament formation only has two states, an ON state and an OFF state.

Response time is shorter in the case of a component that is electrochemically actuated by filament formation. Specifically, in this case only the mobility of ions within the ionic conductor plays a role and is the limiting step in the reaction mechanism.

In the case of insertion, in addition to the mobility in the ionic conductor, the diffusion of ions within the two (positive and negative) electrodes is also a factor, and thus the reaction is slower.

SUMMARY OF THE INVENTION

In this context, the present invention relates to a new electrochemical actuating mode allowing the advantages of the two prior-art modes to be obtained without the associated limitations.

The principle of the present invention consists in producing a component that is tuneable using a new mode of electrochemical actuation, said mode being based on electrodeposition of a metallic layer. The electrodeposition layer is formed by migration (under the action of an electric field) of ions of the metal in question from a storing electrode to a current collector, through an ionic conductor. An illustration of this effect is described in document J. Electrochem. Soc.-2000-517-23. The variation in the response of the component is obtained by forming an electrodeposit and its removal between two electrodes initially separated by an ionic conductor.

More precisely, one subject of the present invention is an electrochemically actuatable electronic component comprising:

a substrate;

at least one first and one second actuating electrodes;

at least one first and one second measuring electrodes that are electrically independent from the first and second actuating electrodes;

at least one storing electrode configured to free ions under the action of the actuating electrodes;

at least one ionic conductor that is able to conduct said ions and that is located in a region placed between said measuring electrodes;

said measuring electrodes being configured to measure at least one characteristic of said region placed between the first and second measuring electrodes;

a device suitable for:
applying a voltage or a current between the first and second actuating electrodes in order to allow either the migration of ions from the storing electrode to the first actuating electrode forming thereon an electrochemical deposition through the ionic conductor or the at least partial dissolution of the electrochemical deposition and for measuring, between the first and second measuring electrodes, a modification of at least one characteristic of the region placed between the first and second measuring electrodes, induced by the formation of the electrochemical deposition or by the at least partial dissolution thereof, so as to determine at least one characteristic of said electronic component.

The ionic conductor may make contact with the storing electrode and with said first actuating electrode.

The storing electrode may make contact with said second actuating electrode.

The characteristic may for example be an electronic conductivity, a permittivity, a thermal conductivity, a refractive index, etc.

Advantageously, the ions are metal ions.

The first actuating electrode may be made of at least one material unable to form a compound with said ions.

Thus, according to the present invention, under the action of actuation via a voltage or a current applied between the two actuating electrodes, and because of the very nature of said actuating electrode, electrodeposition occurs on the first actuating electrode rather than ion insertion into said electrode.

According to variants of the invention, the tuneable electronic component furthermore comprises a saturatable electrode for insertion of said ions, making contact with said first actuating electrode. After a certain quantity of ions have been inserted into said electrode, under the action of actuation via a voltage or a current applied between the two actuating electrodes, electrodeposition also occurs on said first actuating electrode associated with said saturatable insertion electrode while ion insertion into said electrode ceases because said saturatable electrode for insertion of said ions is saturated with ions.

According to variants of the invention, the actuating electrodes are positioned one with respect to the other parallelly to the substrate so as to ensure the formation of an electrodeposit in a plane orthogonal to said substrate, the measuring electrodes being positioned one with respect to the other orthogonally to the substrate.

According to variants of the invention, the actuating electrodes are positioned one with respect to the other orthogonally to the substrate so as to ensure the formation of an electrodeposit in a plane parallel to said substrate, the measuring electrodes being positioned one with respect to the other parallelly to the substrate.

According to variants of the invention, the tuneable electronic component furthermore comprises at least one third measuring electrode and one fourth measuring electrode that are separated by said storing electrode so as to modulate the insertion and deinsertion of ions into/from said storing electrode and to measure a modification of at least one characteristic of the storing electrode.

The characteristic thus possibly measured may be the same as that measured between the first and second measuring electrodes or be a different characteristic.

According to variants of the invention, the storing electrode is made of metal, the metal ions being freed in operation by said storing electrode.

The storing electrode may consist of a metal allowing metal ions to be freed under the action of the actuating electrodes.

According to variants of the invention, the tuneable electronic component furthermore comprises an internal first passivating dielectric and/or an external second passivating dielectric, possibly $SiO_2$ or $Si_3N_4$ or $Al_2O_3$.

According to variants of the invention, the storing electrode is an electrode for storing Li or Ag or Cu or Na or Mg or Al or Ca metal ions.

According to variants of the invention, the storing electrode is made of $LiCoO_2$.

According to variants of the invention, the electrode for inserting ions is made of Si or Ge or Al, the storing electrode including Li ions.

According to variants of the invention, the ionic conductor is a lithium phosphorous nitride (LIPON).

According to variants of the invention, one or the actuating electrodes is (are) made of Cu or Pt.

According to variants of the invention, one or the measuring electrodes is (are) made of Ni or Cu or Mo or W or Pt or ITO conductive oxide (ITO can work, nevertheless the diffusion of ions (Li+ in particular) is then partially irreversible and thus the operation of the component will not be optimal).

Another subject of the invention is an assembly, including on a substrate a plurality of elementary blocks, each elementary block being independently controllable and comprising:
at least one first and one second actuating electrodes;
at least one first and one second measuring electrodes that are electrically independent from the first and second actuating electrodes;
at least one storing electrode configured to free ions;
at least one ionic conductor that is able to conduct said ions and that is located in a region placed between said measuring electrodes;
said measuring electrodes being configured to measure at least one characteristic of said region placed between the first and second measuring electrodes said assembly comprising a device suitable for:
applying in each block, a voltage or a current between the first and second actuating electrodes in order to allow either the migration of ions from the storing electrode to the first actuating electrode forming thereon an electrochemical deposition through the ionic conductor or the at least partial dissolution of the electrochemical deposition and
for measuring in each elementary block, between the first and second measuring electrodes, a modification of at least one characteristic of the region placed between the first and a second measuring electrodes, induced by the formation of the electrochemical deposition or by the at least partial dissolution thereof.

Another subject of the invention is a process for manufacturing a component according to the invention, including the following steps:
depositing and structuring at least one actuating electrode on the surface of a substrate;
depositing and structuring at least one measuring electrode on the surface of said substrate;
depositing and structuring a storing electrode;
depositing and structuring an ionic conductor;
depositing and structuring an internal passivating dielectric.

According to variants of the invention, the storing electrode is deposited by reactive sputtering of a target, the structuring possibly being carried out by photolithography and plasma etching.

According to variants of the invention, the ionic conductor is deposited by reactive sputtering, the structuring possibly being carried out by photolithography and plasma etching.

BRIEF DESCRIPTION OF THE DRAWINGS

The invention will be better understood and other advantages will become apparent on reading the following non-limiting description, which is given with reference to the appended figures, in which.

DETAILED DESCRIPTION

Generally, the subject of the present invention is an electronic component that is tuneable via a new electrochemical actuating mode based on electrodeposition of a metallic layer.

Figure 3A:
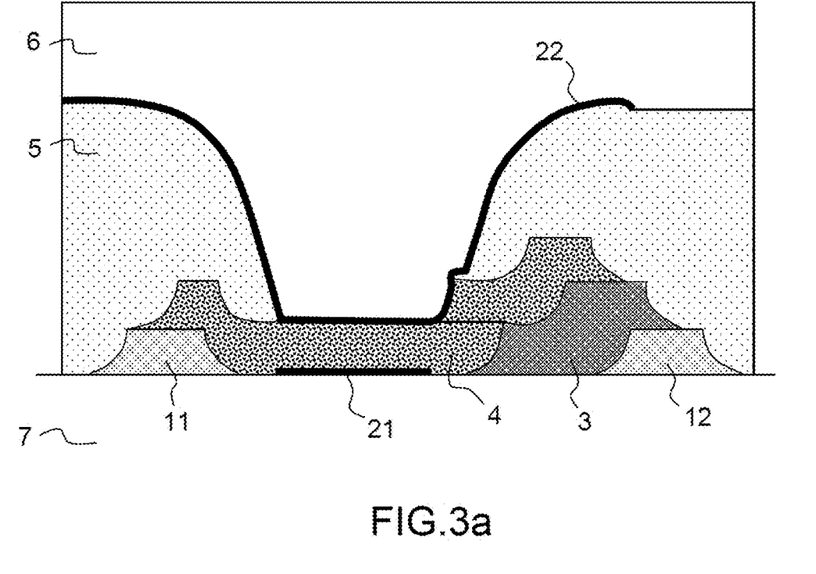
FIGS. 3a and 3b schematically show in cross section a first exemplary component of the invention without actuating voltage and in the presence of an actuating voltage.

FIG. 3a schematically illustrates in cross section an exemplary component architecture according to the invention. The component comprises a first pair of actuating electrodes 11 and 12, a second pair of measuring electrodes 21 and 22, an electrode 3 for storing ions, an ionic conductor 4 and passivating layers 5 and 6, all of which are deposited on a substrate 7.

The operating principle of such a tuneable component is explained below.

Figure 3B:
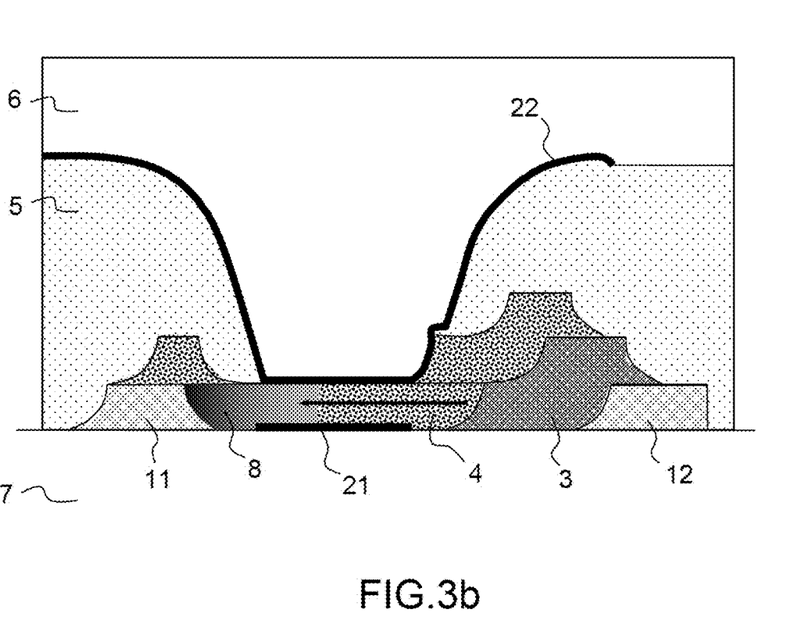

The application of a voltage $U_{actuation}$ between the electrodes 11 and 12 (actuating electrodes) for a time $t_{actuation}$ leads to the migration of ions from the electrode 3 for storing ions through the ionic conductor 4, the ions then accumulating on the surface of the electrode 11 in the form of a continuous deposit. The electrodeposition layer 8 is thus formed in at least one portion of the zone located between the two electrodes 21 and 22 (measuring electrodes), as shown in FIG. 3b. The presence of the electrodeposit induces a modification of at least one of the characteristics of the zone between the measuring electrodes 21 and 22. This characteristic may for example be an electronic conductivity, a permittivity, a thermal conductivity, a refractive index, etc.

The response of the component between the two measuring electrodes 21 and 22 is thus modified because of the modification of the characteristic of the zone between the measuring electrodes 21 and 22, which is associated with the formation of the electrodeposit. The actuating electrodes 11-12 and measuring electrodes 21-22 are separate, contrary to the case of actuation by filament formation.

The application of a voltage $U'_{actuation}$ between the electrodes 11 and 12 leads to the migration of ions in the opposite direction to above, i.e. from the zone of electrodeposition on the surface of the electrode 11 to the storing electrode, and to the insertion therein once more. This operation induces a variation in the response of the component in the opposite direction to the variation induced by the application of the voltage $U_{actuation}$.

The tuneable component such as described has a plurality of possible states of variation in its response:

a state without electrodeposit between the electrodes 21 and 22: the response of the component is directly related to the characteristics of the ionic conductor, present alone in the intermediate zone 21/22;

a state with a complete electrodeposit between the electrodes 21 and 22: in this state all the ions initially present in the storing electrode 3 have migrated to the electrode 11 and formed an electrodeposit thereon;

states with intermediate electrodeposits: in these various states some of the ions initially present in the storing electrode 3 have migrated to the electrode 11 and formed an electrodeposit thereon.

Figure 4A:
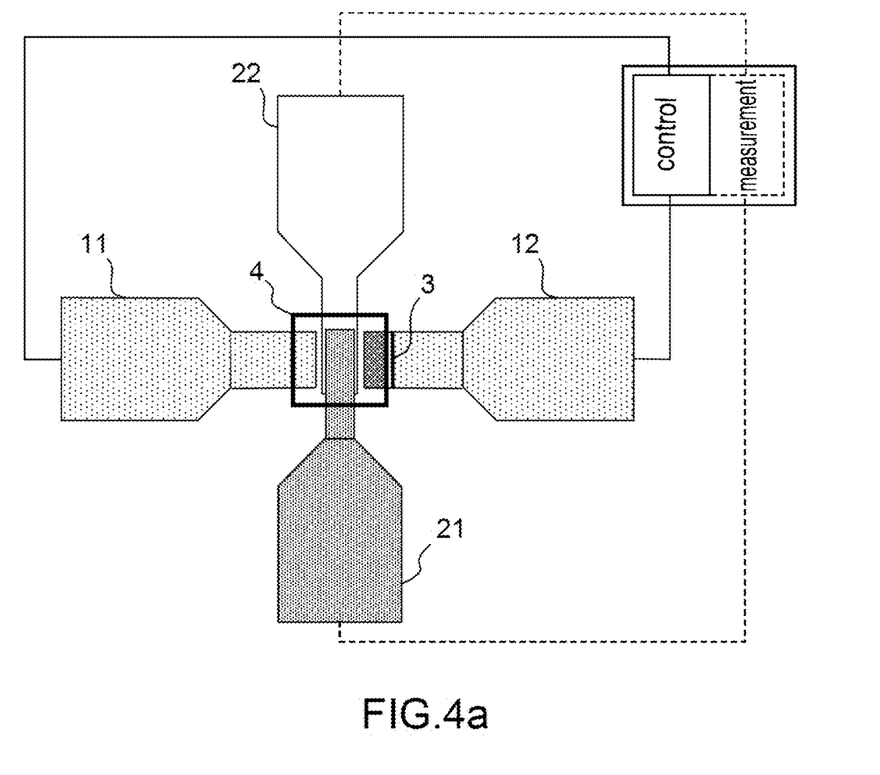
FIGS. 4a and 4b illustrate top views of a tuneable component according to the invention (for the component in the state without and with electrodeposit in the intermediate zone between the measuring electrodes, respectively)
Figure 4B:
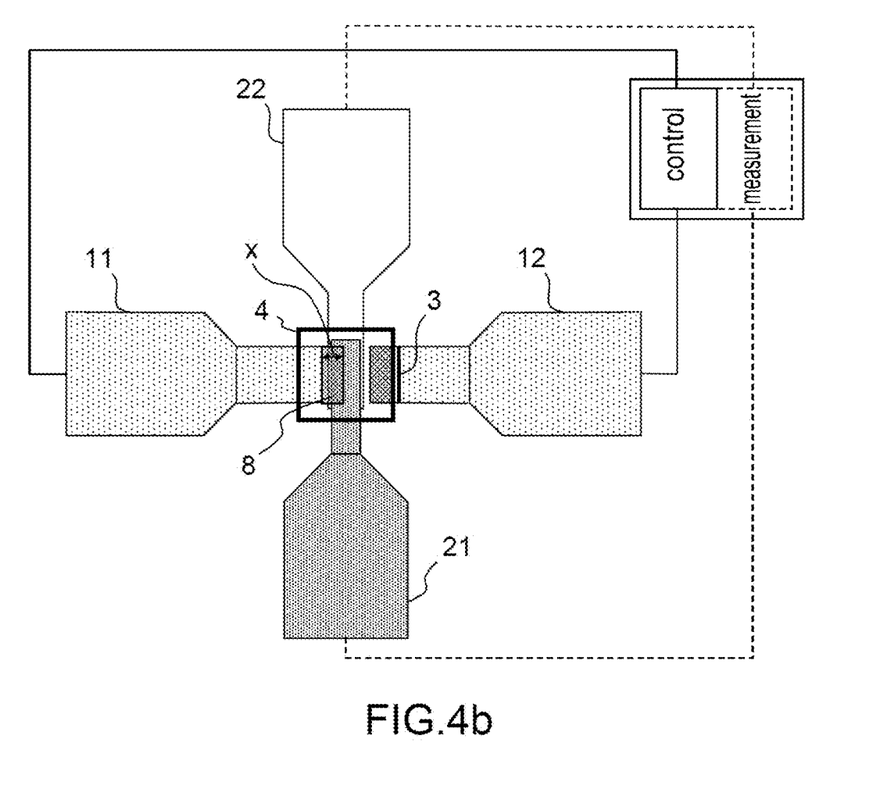

FIGS. 4a and 4b illustrate top views of a tuneable component according to the invention (FIG. 4a and FIG. 4b: for the component in the state without and with electrodeposit in the intermediate zone 21/22, respectively). FIG. 4b shows the presence of the electrodeposit, which is characterized by a width denoted x. This width x varies depending on the actuation conditions of the component; more particularly, this width x is directly correlated to the time $t_{actuation}$ of application of the voltage $U_{actuation}$. The variation in this width x allows the properties of the intermediate zone 21/22 to be changed and therefore intermediate responses (between that without electrodeposit and that with a complete electrodeposit) to be obtained from the tuneable component. It will be noted that the width x extends from the edge of the electrode 11 to a limit that is necessarily beyond the edge of the electrode 22 (FIG. 4b); in other words, the thickness of the electrodeposit (equal to the width x) is necessarily larger than the distance between the electrodes 11 and 21 in FIG. 4b.

According to one particular operating mode, the application of a current $I_{actuation}$ (instead of a voltage as above) between the electrodes 11 and 12 for a time $t_{actuation}$ is used to make the ions migrate to the electrode 11 (formation of the electrodeposit), and a current I'$_{actuation}$ is applied for a time t'$_{actuation}$ and is used to ensure the migration in the opposite direction (reinsertion into the storing electrode 3).

According to another particular operating mode, the application of a current I$_{actuation}$ between the electrodes 11 and 12 for a time t$_{actuation}$ is used to make the ions migrate to the electrode 11 (formation of the electrodeposit), and a voltage U$_{actuation}$ is applied for a time t'$_{actuation}$ and is used to ensure the migration in the opposite direction (reinsertion into the storing electrode 3).

According to another particular operating mode, the application of a voltage U$_{actuation}$ between the electrodes 11 and 12 for a time t$_{actuation}$ is used to make the ions migrate to the electrode 11 (formation of the electrodeposit), and a current I$_{actuation}$ is applied for a time t'$_{actuation}$ and is used to ensure the migration in the opposite direction (reinsertion into the storing electrode 3).

The various aforementioned modes allow the electrodeposit to be formed in various ways to meet constraints that may be different from one application to the next. For example, the use of a high actuation current allows the electrodeposit to be formed in a very short space of time, whereas the use of a voltage allows the thickness of the formed electrodeposit to be precisely controlled.

Figure 5A:
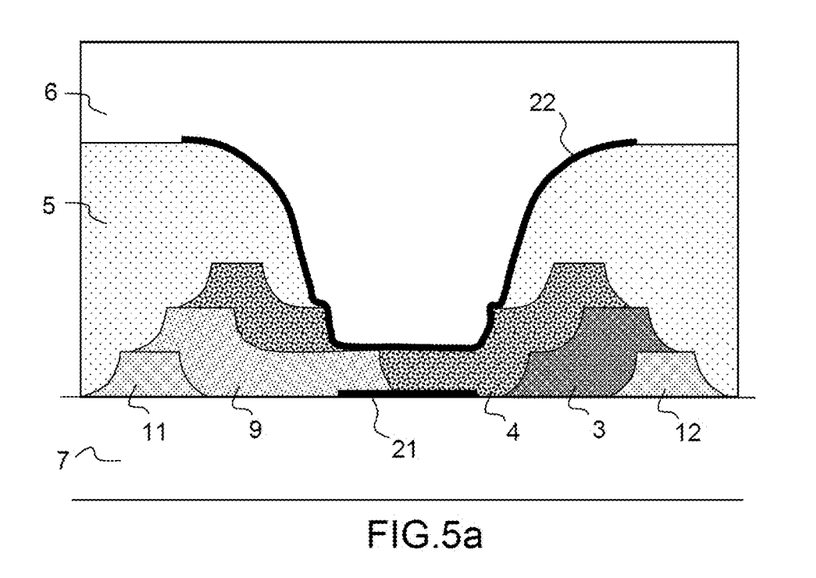
FIGS. 5a and 5b illustrate a variant of the invention in which the tuneable electronic component furthermore includes an additional electrode called an insertion electrode that is "saturatable" with the ion (for the component in the state without and with electrodeposit in the intermediate zone between the measuring electrodes, respectively)
Figure 5B:
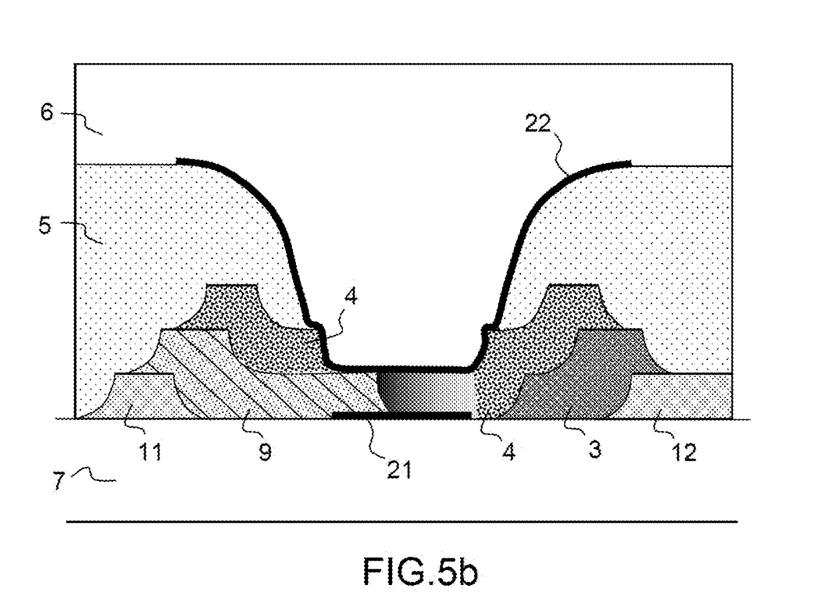

According to another variant of the invention illustrated in FIGS. 5a and 5b, the tuneable electronic component furthermore includes an additional electrode 9, called the insertion electrode, that is "saturatable" with the ion in question, thereby making it possible to make use of intermediate states. Specifically, a saturatable electrode (for example of Si, Ge or Al in the case where the ion is Li$^+$) is capable of absorbing an amount of ions until saturation, from which point ions reaching the electrode start to form a layer of the metal of the ion in question and a phase of electrodeposition commences. In this way, the response of the intermediate zone defined between the electrodes 21/22 is influenced by the various states of insertion of the layer 9, and the number of possible intermediate states of the component is increased.

Figure 6A:
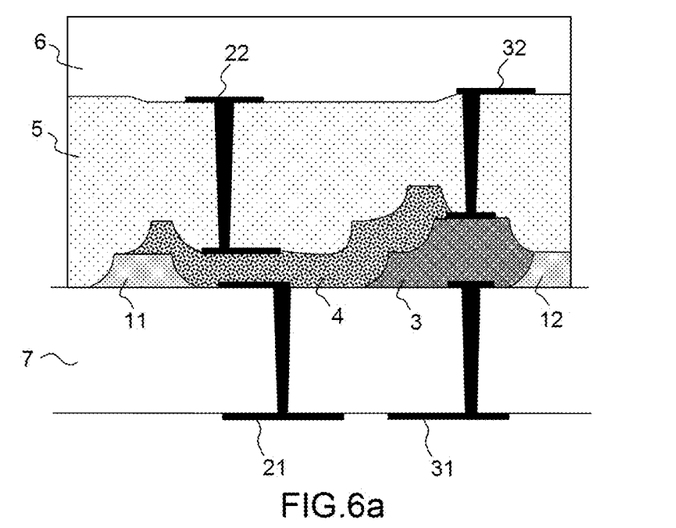
FIGS. 6a and 6b illustrate a variant of the invention in which the tuneable electronic component takes advantage of the possible variation associated with the insertion/deinsertion into/from the storing electrode with the addition of a pair of electrodes separated by the storing electrode (for the component in the state without and with electrodeposit in the intermediate zone between the measuring electrodes, respectively)
Figure 6B:
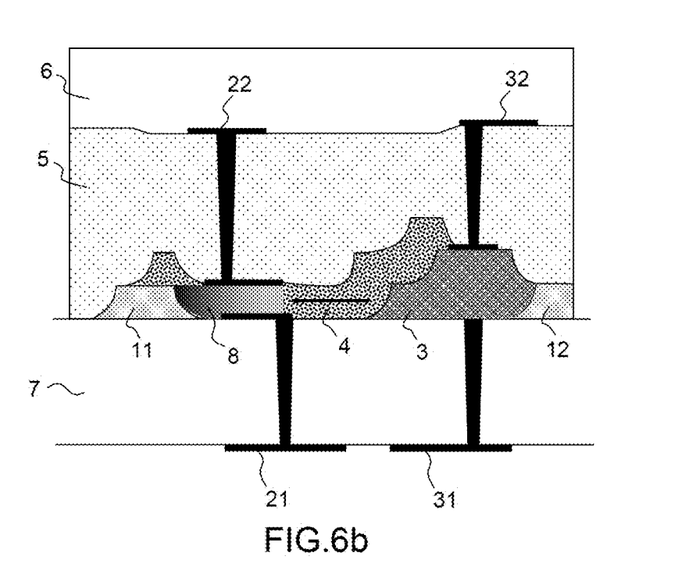

According to another variant of the invention illustrated in FIGS. 6a and 6b, the tuneable electronic component takes advantage of the possible variation associated with insertion/deinsertion into/from the storing electrode. This approach implies the addition of a pair of electrodes 31/32 separated by the storing electrode 3, and allowing, by virtue of this architecture, the response of the tuneable component to be modulated (the response modulated being the same as that between 21/22 or a different response). According to this variant, the contacts of the electrodes 21 and 31 are redistributed to the bottom side (in the figures) by way of vias through the substrate 7.

Figure 7A:
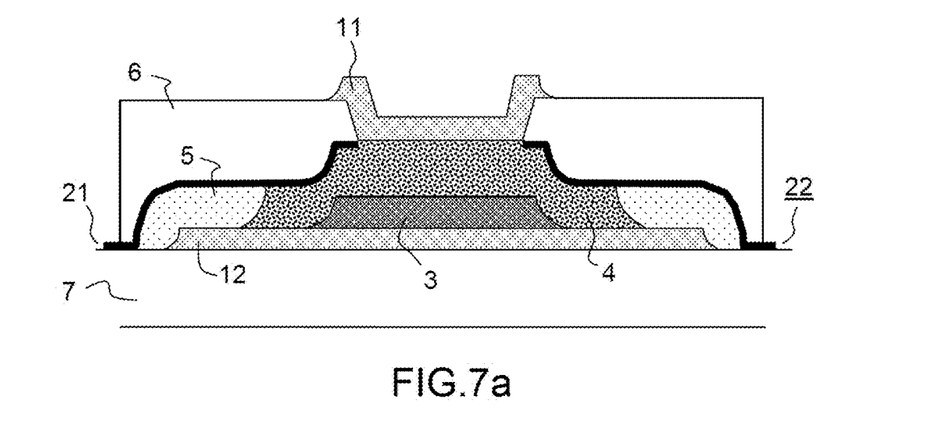
FIGS. 7a and 7b illustrate a variant of the invention in which the tuneable electronic component has a configuration allowing the formation of the electrodeposit in a plane parallel to the substrate (for the component in the state without and with electrodeposit in the intermediate zone between the measuring electrodes, respectively)
Figure 7B:
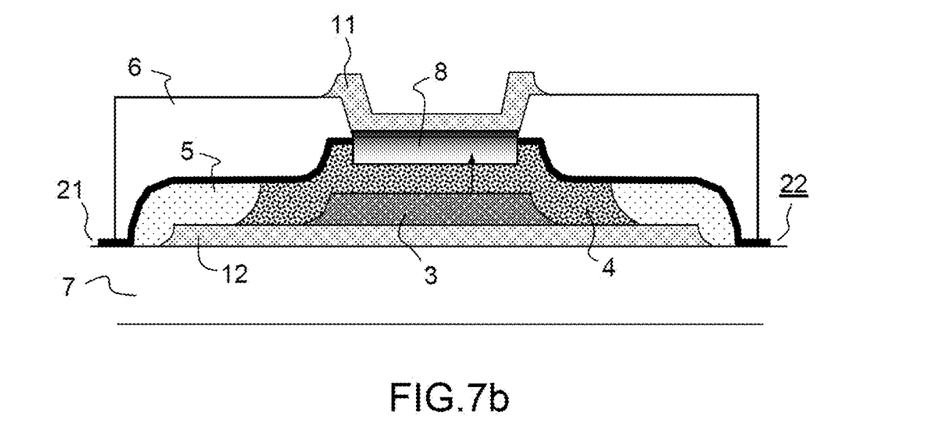

According to another variant of the invention illustrated in FIGS. 7a and 7b, the tuneable electronic component may also have a configuration allowing a formation of the electrodeposit in a plane parallel to the substrate (in the variants of the invention described above, the electrodeposit is formed in a plane orthogonal to the substrate). The electrodes 12/3/11 are placed in planes parallel to the plane of the substrate.

Figure 8A:
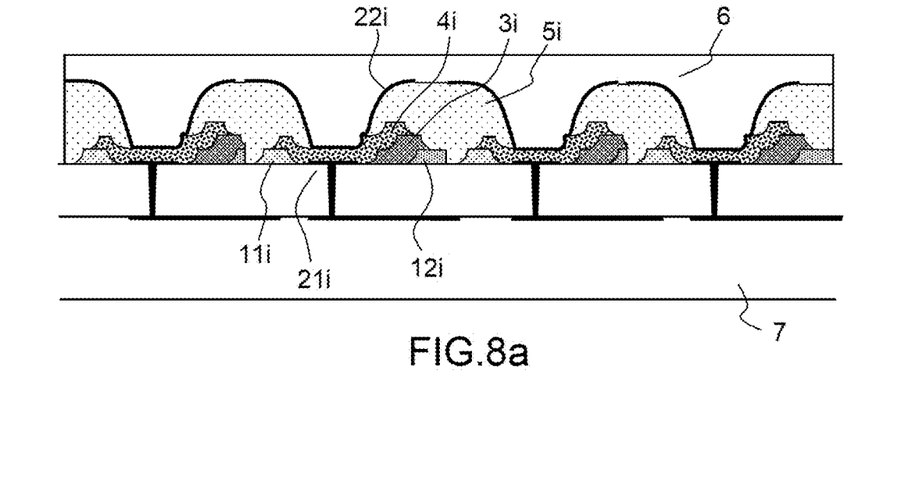
FIGS. 8a and 8b illustrate an assembly of tuneable electronic functions according to the invention (for the component in the state without and with electrodeposit in the intermediate zone between the measuring electrodes, respectively).
Figure 8B:
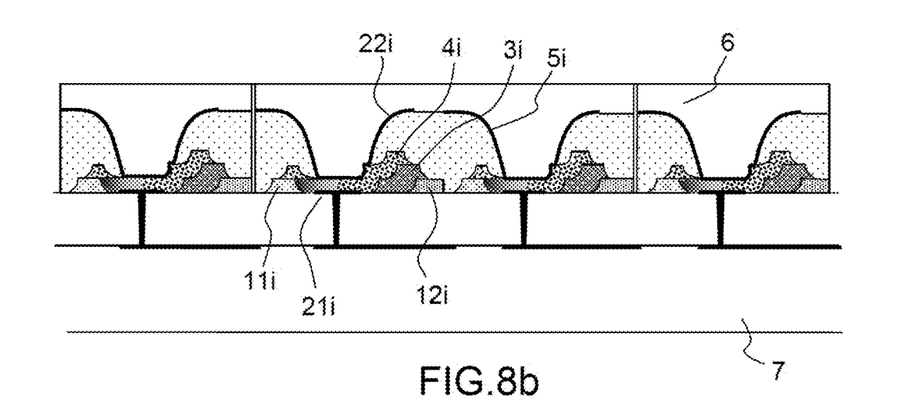

Advantageously it is possible to produce, according to the present invention, an assembly of tuneable electronic functions on a given substrate is illustrated in FIGS. 8a and 8b and comprising a plurality of types of tuneable blocks according to the architecture of the invention, each block being independently controllable. All the blocks may be identical, or have certain differences.

On a common substrate 7, the various blocks comprise:
a pair of actuating electrodes 11$i$/12$i$;
a pair of measuring electrodes 21$i$/22$i$;
a storing electrode 3$i$;
an ionic conductor 4$i$;
an internal insulator 5$i$;
a common external insulator 6 encapsulating all of the aforementioned elements.

According to the present invention, it is thus possible to vary a number of properties that are, for example: electronic (non-volatile memories NVMs, switches, RF switch), thermal (thermal switch), optical (filters, waveguides), ferro/magneto (capacitor), etc.

Exemplary Process for Producing a Tuneable Component According to the Invention:

Step 1:

A substrate, for example made of silicon, or of glass, or of another semiconductor, is cleaned. The cleaning may comprise a heat treating step (200° C., 15 min), followed by an RCA chemical treatment (for example based on NH$_4$OH: H$_2$O$_2$ and HCl:H$_2$O$_2$).

Step 2:

Two 0.25 µm-thick actuating electrodes, which are for example made of Cu or Pt, are deposited and structured. A layer of Pt deposited by PVD sputtering may be structured by photolithography and etched in an aqua regia type chemical solution (mix of HCl+HNO$_3$).

Step 3:

A 0.25 µm-thick measuring electrode, which is for example made of Ni, Cu, Mo, W, Pt or a transparent conductive oxide of ITO composition, is deposited and structured. A layer of Pt deposited by PVD sputtering may be structured by photolithography and etched in an aqua regia type chemical solution (mix of HCl+HNO$_3$). The layer of the first measuring electrode may be obtained simultaneously with those of the actuating electrodes if the selected material is the same.

Step 4:

A 1 µm-thick electrode for storing ions, which is for example an LiCoO$_2$ oxide composition (in this precise case it is a question of storing lithium ions Li$^+$), is deposited and structured. The LiCoO$_2$ layer may be obtained by sputtering an LiCoO$_2$ target under Ar and may be etched in an Ar inductively coupled plasma.

Step 5:

A 1.5 µm-thick ionic conductor, which is for example made of LiPON (Li$^+$ ion conduction), is deposited and structured. The LiPON layer may be deposited by reactive sputtering of a Li$_3$PO$_4$ target under nitrogen N$_2$, structured by photolithography and etched in an Ar inductively coupled plasma.

Step 6:

A 1 µm-thick passivating dielectric, which is for example made of SiO$_2$, Si$_3$N$_4$, Al$_2$O$_3$ or a polymer, is deposited and structured. For example, a layer of Si$_3$N$_4$ may be deposited by PECVD, structured by photolithography and etched in an Ar inductively coupled plasma.

Step 7:

A 0.25 µm-thick second measuring electrode, which is for example made of Ni, Cu, Mo, W, Pt or a transparent conductive oxide of ITO composition, is deposited and structured. A layer of Pt deposited by physical vapour phase (PVD) sputtering may be structured by photolithography and etched in an aqua regia type chemical solution (mix of HCl+HNO$_3$).

Step 8:

A 2 μm-thick passivating dielectric, which is for example made of $SiO_2$, $Si_3N_4$, $Al_2O_3$ or a polymer, is deposited and structured. For example, a layer of $Si_3N_4$ may be deposited by plasma-enhanced chemical vapour deposition (PECVD), structured by photolithography and etched in an Ar inductively coupled plasma.

The advantages of the present invention are outlined in Table 2 below and their benefit is especially seen:

in terms of geometry, which is: volumic (thin layer), continuous and able to ensure a contact over a large area and/or height;

in terms of modulation ratio, which is: high insofar as the two extreme states are associated with two intrinsically different materials (the ionic conductor and the electrodeposit);

in terms of intermediate states: possible states corresponding to a certain thickness of the formed electrodeposition layer, said thickness theoretically being controllable on the nanoscale;

in terms of response time, which is: shorter than in the case of an electrochemical actuation by insertion, because the diffusion occurs only within a single electrode contrary to systems comprising two electrodes.

TABLE 2

Comparison of the performance of tuneable components (prior art vs. invention) with respect to the actuating mode implemented.

|  | Electrochemical actuation by insertion | Electrochemical actuation by filament formation | Invention |
| --- | --- | --- | --- |
| Geometry | 2D/3D (+) | 1D (−) | 2D/3D (+) |
| Modulation ratio | Average (−) | High (+) | High (+) |
| Intermediate states | Yes (+) | No (−) | Yes (+) |
| Response time | >100 μs (−) | <1 μs (+) | 1-100 μs |
| Actuation voltage | low (1-2 V) (+) | low (1-2 V) (+) | low (1-2 V) (+) |
| Energy consumption | low (0.1-1 μJ) (+) | low (0.1-1 μJ) (+) | low (0.1-1 μJ) (+) |

By virtue of the present invention, it is thus possible to design tuneable electronic components that may especially be resistive, or capacitive or inductive.

They may also be electrical microswitches (switches), radiofrequency electrical microswitches (RF switches), thermal valves or microswitches, non-volatile memory, non-volatile multiple valued logic memories (multiple valued logic memories).

The invention claimed is:

1. An electrochemically actuatable electronic component comprising:
   a substrate;
   at least one first and one second actuating electrodes;
   at least one first and one second measuring electrodes that are electrically independent from the first and second actuating electrodes;
   at least one storing electrode configured to free ions under the action of the actuating electrodes;
   at least one ionic conductor that is able to conduct said ions and that is located in a region placed between said measuring electrodes;
   said measuring electrodes being configured to measure at least one characteristic of said region placed between the first and second measuring electrodes;
   a device suitable for:
      applying a voltage or a current between the first and second actuating electrodes in order to allow either the migration of ions from the storing electrode to the first actuating electrode forming thereon an electrochemical deposition through the ionic conductor or the at least partial dissolution of the electrochemical deposition and
      for measuring, between the first and second measuring electrodes, a modification of at least one characteristic of the region placed between the first and second measuring electrodes, induced by the formation of the electrochemical deposition or by the at least partial dissolution thereof, so as to determine at least one characteristic of said electronic component.

2. The electronic component according to claim 1, wherein the ionic conductor makes contact with the storing electrode and with said first actuating electrode.

3. The electronic component according to claim 1, wherein at least said first actuating electrode is made of a material unable to form a compound with said ions.

4. The electronic component, according to claim 1, wherein the storing electrode makes contact with said second actuating electrode.

5. The electronic component according to claim 1, further comprising an electrode that is insertionally saturatable with said ions making contact with said ionic conductor and contact with said first actuating electrode.

6. The electronic component according to claim 5, wherein the storing electrode is an electrode for storing Li or Ag or Cu or Na or Mg or Al or Ca metal ions, and wherein the electrode for inserting ions is made of Si or Ge or Al, the storing electrode including Li ions.

7. The electronic component according to claim 1, wherein the actuating electrodes are positioned one with respect to the other parallelly to the substrate so as to ensure the formation of an electrodeposit in a plane orthogonal to said substrate, the measuring electrodes being positioned one with respect to the other orthogonally to the substrate.

8. The electronic component according to claim 1, wherein the actuating electrodes are positioned one with respect to the other orthogonally to the substrate so as to ensure the formation of an electrodeposit in a plane parallel to said substrate, the measuring electrodes being positioned one with respect to the other parallelly to the substrate.

9. The electronic component according to claim 1, further comprising at least one third measuring electrode and one fourth measuring electrode that are separated by said storing electrode so as to modulate the insertion and deinsertion of ions into/from said storing electrode and to measure a modification of at least one characteristic of the storing electrode.

10. The electronic component according to claim 1, further comprising an internal first passivating dielectric and/or an external second passivating dielectric, wherein any of the internal first passivating dielectric and the external second passivating dielectric comprises $SiO_2$ or $Si_3N_4$ or $Al_2O_3$.

11. The electronic component according to claim 1, wherein the storing electrode is an electrode for storing Li or Ag or Cu or Na or Mg or Al or Ca metal ions.

12. The electronic component according to claim 11, wherein the storing electrode is made of $LiCoO_2$.

13. The electronic component according to claim 1, wherein the storing electrode consists of a metal allowing metal ions to be freed under the action of the actuating electrodes.

14. The electronic component according to claim 1 wherein, the ionic conductor is a lithium phosphorous nitride.

15. The electronic component according to claim 1, wherein one or both of the actuating electrodes is (are) made of Cu or Pt.

16. The electronic component according to claim 1, wherein one or both of the measuring electrodes is (are) made of Ni or Cu or Mo or W or Pt or ITO conductive oxide.

17. A process for manufacturing a component according to claim 1, including the following steps:
depositing and structuring at least one actuating electrode on the surface of a substrate;
depositing and structuring at least one measuring electrode on the surface of said substrate;
depositing and structuring a storing electrode; depositing and structuring an ionic conductor;
depositing and structuring an internal passivating dielectric.

18. The process for manufacturing a tuneable component according to claim 17, wherein the storing electrode is deposited by reactive sputtering of a target, the structuring being carried out by photolithography and plasma etching.

19. The process for manufacturing a tuneable component according to claim 17, wherein the ionic conductor is deposited by reactive sputtering, the structuring being carried out by photolithography and plasma etching.

20. An assembly, including on a substrate a plurality of elementary blocks, each elementary block being independently controllable and comprising:

at least one first and one second actuating electrodes;
at least one first and one second measuring electrodes that are electrically independent from the first and second actuating electrodes;
at least one storing electrode configured to free ions;
at least one ionic conductor that is able to conduct said ions and that is located in a region placed between said measuring electrodes;
said measuring electrodes being configured to measure at least one characteristic of said region placed between the first and second measuring electrodes,
said assembly comprising a device suitable for:
applying in each block, a voltage or a current between the first and second actuating electrodes in order to allow either the migration of ions from the storing electrode to the first actuating electrode forming thereon an electrochemical deposition through the ionic conductor or the at least partial dissolution of the electrochemical deposition and
for measuring in each elementary block, between the first and second measuring electrodes, a modification of at least one characteristic of the region placed between the first and a second measuring electrodes, induced by the formation of the electrochemical deposition or by the at least partial dissolution thereof.

* * * * *